United States Patent
Chen

(10) Patent No.: US 10,962,885 B2
(45) Date of Patent: Mar. 30, 2021

(54) EXTREME ULTRAVIOLET (EUV) POLARIZATION SPLITTER

(71) Applicant: TAIWAN SEMICONDUCTOR MANUFACTURING CO., LTD., Hsinchu (TW)

(72) Inventor: Minfeng Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/584,286

(22) Filed: Sep. 26, 2019

(65) Prior Publication Data

US 2020/0124978 A1    Apr. 23, 2020

Related U.S. Application Data

(60) Provisional application No. 62/738,957, filed on Sep. 28, 2018.

(51) Int. Cl.
*G03F 7/20* (2006.01)
*G02B 1/08* (2006.01)
*G02B 27/28* (2006.01)

(52) U.S. Cl.
CPC ....... *G03F 7/70191* (2013.01); *G02B 27/283* (2013.01)

(58) Field of Classification Search
CPC .... G02B 30/25; G02B 27/286; G02B 27/283; G02B 5/3025; G02B 27/288; G02B 5/208; G02B 5/3016; G02B 5/3083; G02B 5/30; G02B 5/3066; G02B 1/08; G02B 27/281; G02B 5/20; G02B 27/0101; G02B 5/305; G02B 26/00; G02B 27/28; G02B 5/22; G02B 6/126; G02B 23/2461; G02B 5/3075; G02B 6/0056; G02B 17/0892; G02B 5/0891; G02B 27/0172; G02B 1/10; G01J 3/0224; G01J 5/0825; G01J 5/0862; G01J 1/0429; G01J 1/0488; G01J 4/00; G01J 3/447; H04N 13/337; H04N 5/2254; G03F 7/70191; G03F 7/70566; G03F 1/48; G03F 1/22; G03F 7/70633; G03F 7/706; G03F 1/24; G03F 7/70316; G03F 7/70958; G03F 1/60; B82Y 10/00; G21K 1/062; H01L 33/60; H01L 33/32
See application file for complete search history.

(56) References Cited

U.S. PATENT DOCUMENTS

| | | |
|---|---|---|
| 8,796,666 B1 | 8/2014 | Huang et al. |
| 9,093,530 B2 | 7/2015 | Huang et al. |
| 9,184,054 B1 | 11/2015 | Huang et al. |
| 9,213,232 B2 | 12/2015 | Hsu et al. |
| 9,256,123 B2 | 2/2016 | Shih et al. |

(Continued)

*Primary Examiner* — Mesfin T Asfaw
(74) *Attorney, Agent, or Firm* — McDermott Will & Emery LLP

(57) ABSTRACT

A polarization filter includes a multilayer structure including a first plurality of elements and a second plurality of elements alternating between each other. The first plurality of elements and the second plurality of elements have different thicknesses, and the multilayer structure is configured to interact with unpolarized light incident on the multilayer structure and separate transverse electric (TE) waves and transverse magnetic (TM) waves of the unpolarized light.

18 Claims, 11 Drawing Sheets

(56) References Cited

U.S. PATENT DOCUMENTS

| | | |
|---|---|---|
| 9,529,268 B2 | 12/2016 | Chang et al. |
| 9,548,303 B2 | 1/2017 | Lee et al. |
| 9,618,837 B2 | 4/2017 | Lu et al. |
| 9,851,641 B2 | 12/2017 | Patra |
| 9,869,928 B2 | 1/2018 | Huang et al. |
| 9,869,934 B2 | 1/2018 | Huang et al. |
| 9,869,939 B2 | 1/2018 | Yu et al. |
| 2015/0253677 A1* | 9/2015 | Maul ............... G02B 17/06 355/71 |
| 2015/0323874 A1* | 11/2015 | Saenger ........... G02B 5/0891 355/71 |

* cited by examiner

EXTREME ULTRAVIOLET (EUV) POLARIZATION SPLITTER

CROSS REFERENCE TO RELATED APPLICATION

This application claims priority of U.S. Provisional Patent Application No. 62/738,957 filed on Sep. 28, 2018, the entire contents of which are incorporated herein by reference.

BACKGROUND

During semiconductor wafer fabrication, a lithographic process is typically utilized to transfer a pattern from a mask to the semiconductor wafer. One method of fabricating smaller patterns is to use shorter wavelength of light. Extreme ultraviolet (EUV) lithography is being used to fabricate semiconductor devices having feature size of less than 22 nm to meet the ever-present demand of increased device density in integrated circuits.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
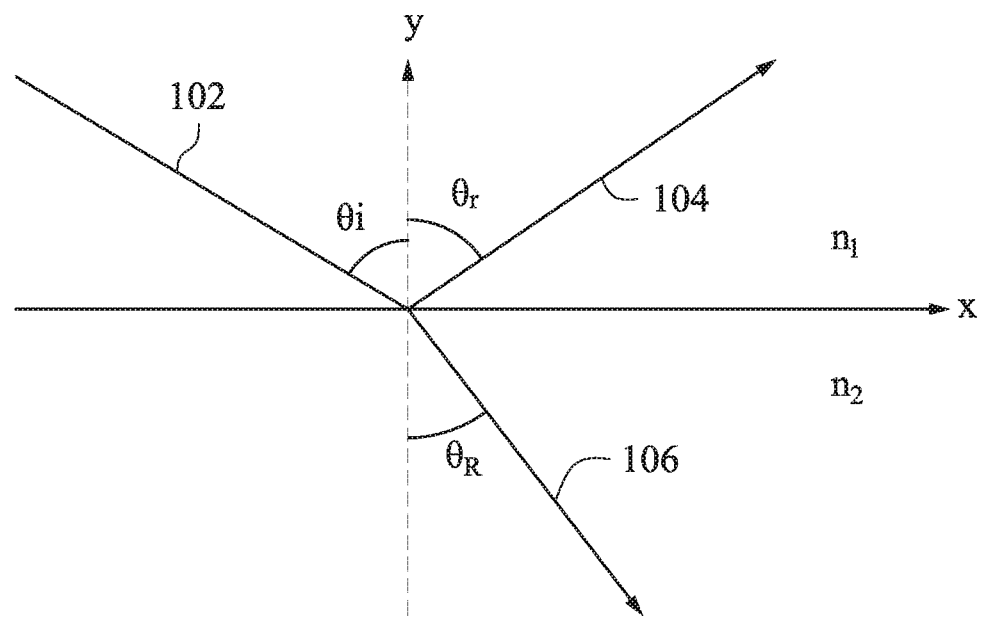
FIG. 1 illustrates a ray diagram depicting an incident ray of light incident on a medium having refractive index n2 from a medium having refractive index n1.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

As pattern size continues to decrease in advanced wafer fabrication processes, it becomes more difficult to print a high-contrast image on the semiconductor wafer during lithographic processing. One method of increasing the contrast of the image projected on the wafer utilizes polarized light for illumination in the lithographic process. Polarized light can be provided by utilizing an optical polarizer to polarize incident light that is in an unpolarized, i.e. a randomly polarized, state. Extreme ultraviolet (EUV) light can pass through a wide variety of materials including materials that block visible light. Some of the extreme ultraviolet (EUV) light gets absorbed by the material the extreme ultraviolet (EUV) light is passing through. This limits the design of a filtering device to filter light waves for a specific polarization. Traditional methods such as metal gratings which block light in the optical frequencies do not block light in the extreme ultraviolet (EUV) range.

When light (or other electromagnetic radiation) traveling through a medium having a refractive index (RI) of a first value is incident on a medium having an RI of a second value different from the first value, then, at the boundary (or interface) between the two media, the incident light is split into its constituent transverse electric (TE) waves and transverse magnetic (TM) waves. The transverse magnetic (TM) wave is refracted (or transmitted) through the second medium and the transverse electric (TE) waves are reflected back into the first medium. The amount of reflected and refracted light depends on the differences of the RI values and/or the angle of incidence of the light.

FIG. 1 illustrates a ray diagram depicting an incident ray of light (or other electromagnetic radiation) 102 traveling in a first medium having refractive index n1 and incident on a second medium having refractive index n2. The incident ray 102 is incident on a second medium having a refractive index n2 at an angle of incidence θi. At the boundary between the two media, the incident ray 102 is split with one part being reflected into the first medium, depicted by the reflected ray 104, and another part being refracted into the second medium, depicted by the refracted ray 106. The reflected ray 104 exhibits an angle of reflection θr and the refracted ray 106 exhibits an angle of refraction θR. In some embodiments, when the incident ray 102 represents unpolarized light, the reflected ray 104 represents transverse electric (TE) wave of the unpolarized light, and the refracted ray 106 represents transverse magnetic (TM) wave of the unpolarized light.

Figure 2:
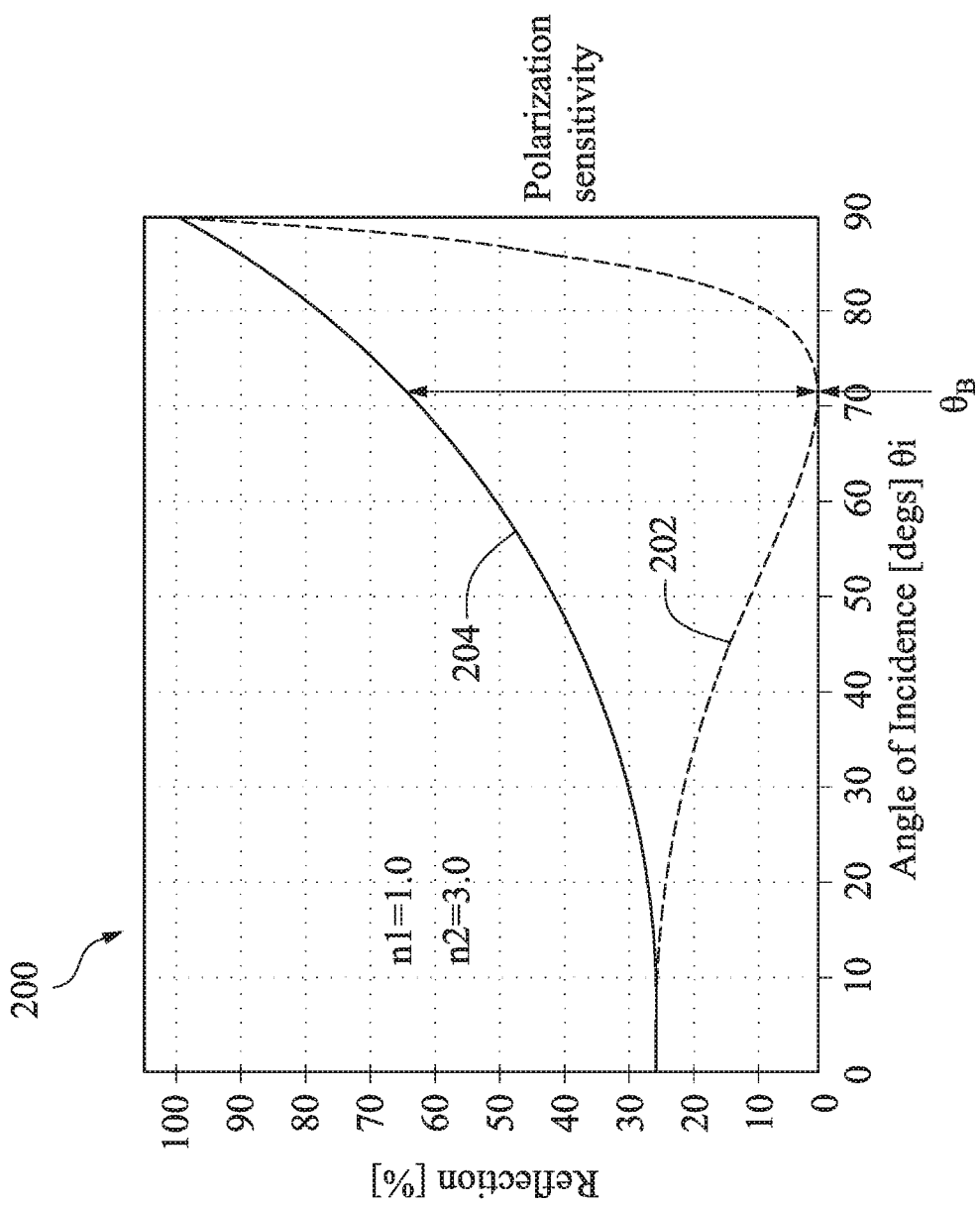
FIG. 2 is a graph illustrating a simulated result of the variation in the reflection of the light based on the angle of incidence θi of the unpolarized EUV light in FIG. 1.

FIG. 2 is a graph 200 illustrating a simulated result of the variation in the reflection of the light based on the angle of incidence θi of the unpolarized EUV light in FIG. 1. In the simulation, the refractive index n1 was set to 1 and refractive index n2 was set to 3. EUV light is composed of transverse electric (TE) waves and transverse magnetic (TM) waves. In FIG. 2, the trace 202 indicates that the reflection (indicated as a percentage of incident unpolarized light) of the transverse magnetic (TM) wave decreases with an increase in the angle of incidence θi. The reflection of the transverse magnetic (TM) wave is the least at a certain angle of incidence θi which is the Brewster's angle $\theta_B$. At the Brewster's angle $\theta_B$, the incident unpolarized EUV light is substantially polarized, in that the reflected light is substantially composed of transverse electric (TE) waves, while the transmitted light is substantially composed of transverse magnetic (TM) waves. Referring to FIG. 2, increasing the angle of incidence θi beyond the Brewster's angle $\theta_B$, causes the reflection of the transverse magnetic (TM) wave to increase. Stated otherwise, the refraction (or transmission through the second medium) of the transverse magnetic (TM) wave increases till the Brewster's angle $\theta_B$, after which the refraction (transmission) decreases.

The trace 204 indicates that reflection of the transverse electric (TE) wave increases with an increase in the angle of incidence θi. The polarization sensitivity of the extreme ultraviolet (EUV) light is the maximum at the Brewster's angle $\theta_B$ at which the separation between the reflection of the transverse magnetic (TM) wave and reflection of the transverse electric (TE) wave is the maximum. In other words, when the polarization sensitivity is the maximum, the extreme ultraviolet (EUV) light reflecting from the boundary between the two media has the least transverse magnetic (TM) wave and the maximum transverse electric (TE) wave.

Radiation such as deep ultraviolet (DUV) light having a wavelength of 193 nm used in deep ultraviolet (DUV) lithography exhibits high polarization sensitivity. As such, it is possible to split the deep ultraviolet (DUV) light into its constituent transverse electric (TE) and transverse magnetic (TM) waves using two (or more) media having a high refractive index contrast, as discussed above. Extreme ultraviolet (EUV) lithography is performed using unpolarized extreme ultraviolet (EUV) light (also referred to as EUV radiation). Unlike deep ultraviolet (DUV) light, refractive indices of materials of uniform structure/composition are very close to 1 for extreme ultraviolet (EUV) light. As a result, it is not possible to obtain a high refractive index contrast material for splitting extreme ultraviolet (EUV) light with uniform structure/composition materials.

Example embodiments are directed to a polarization splitter (also referred to as an EUV polarization splitter) for splitting unpolarized extreme ultraviolet (EUV) light (also referred to as EUV radiation) into its constituent components transverse electric (TE) waves and transverse magnetic (TM) waves. The transverse electric (TE) waves provides very high image contrast during extreme ultraviolet (EUV) exposure. The polarization splitter directs the transverse electric (TE) waves and the transverse magnetic (TM) waves of the unpolarized extreme ultraviolet (EUV) light incident on the extreme ultraviolet (EUV) polarization splitter into different pathways. The transverse electric (TE) waves can thus be utilized for extreme ultraviolet (EUV) exposure.

The extreme ultraviolet (EUV) polarization splitter, according to embodiments disclosed, includes a multiple layer (ML) structure that includes a plurality of film pairs. In some embodiments, the plurality of film pairs includes molybdenum-silicon (Mo/Si) film pairs (e.g., a layer of molybdenum above or below a layer of silicon in each film pair). In other embodiments, the multiple layers (ML) structure includes molybdenum-beryllium (Mo/Be) film pairs, or other suitable material that provides a required degree of polarization of the incident extreme ultraviolet (EUV) light. By varying the thickness of the plurality of film pairs and/or the angle of incidence of the extreme ultraviolet (EUV) radiation, a desired degree of polarization of the extreme ultraviolet (EUV) light can be obtained. For the sake of explanation, the multiple layers (ML) structure discussed herein includes molybdenum-silicon (Mo/Si) film pairs. However, embodiments are not limited in this regard, and a multiple layers (ML) structure including film pair of any desired material can be utilized to provide a desired degree of polarization and refractive index contrast, without departing from the scope of the disclosure.

Figure 3:
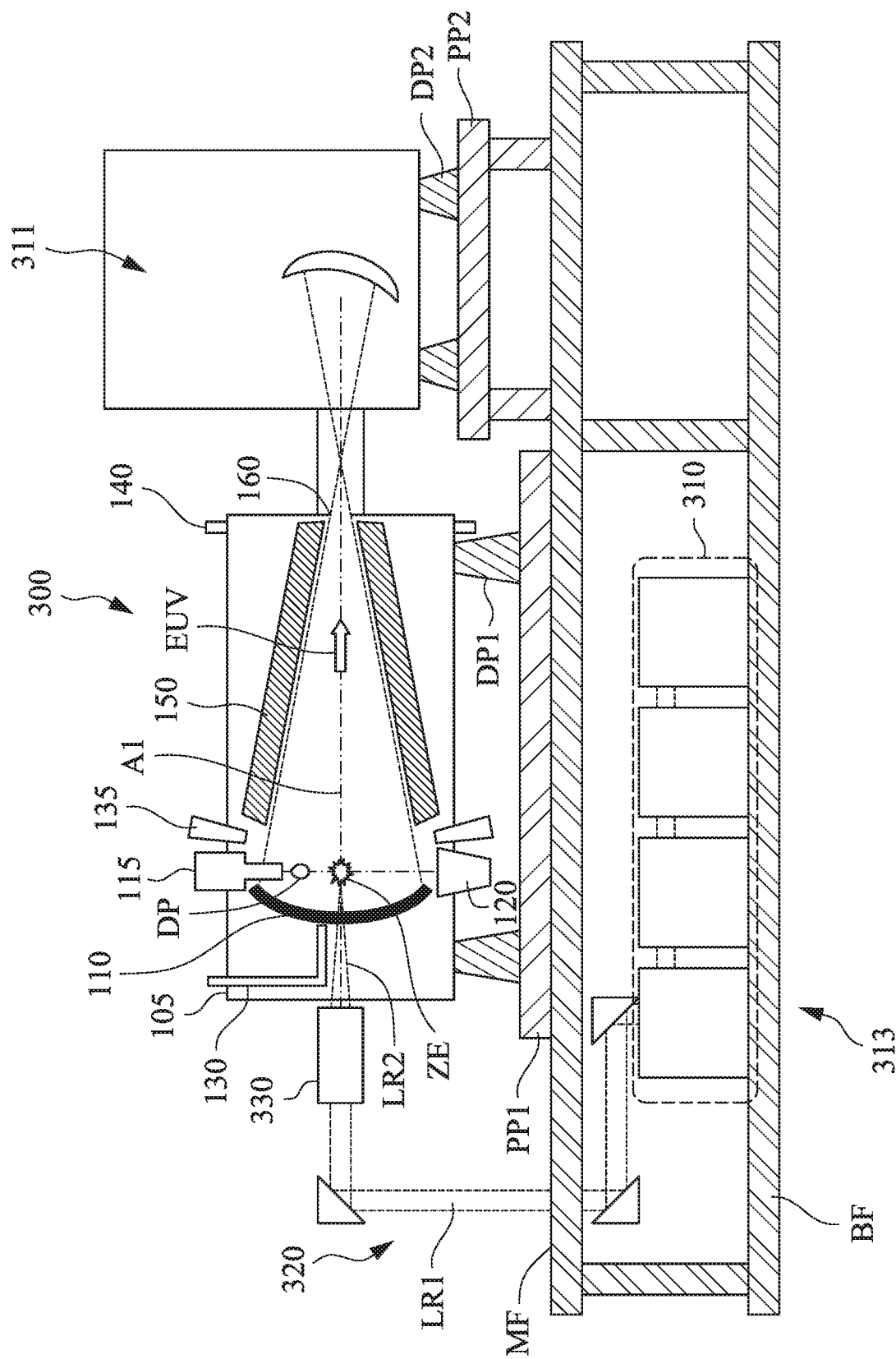
FIG. 3 is a schematic and diagrammatic view of an extreme ultraviolet (EUV) lithography system.

FIG. 3 is a schematic and diagrammatic view of an extreme ultraviolet (EUV) lithography system. The extreme ultraviolet (EUV) lithography system includes an extreme ultraviolet (EUV) radiation source apparatus 300 to generate extreme ultraviolet (EUV) light, an exposure tool 311, such as a scanner, and an excitation laser source apparatus 313. As shown in FIG. 3, in some embodiments, the extreme ultraviolet (EUV) radiation source apparatus 300 and the exposure tool 311 are installed on a main floor MF of a clean room, while the excitation laser source apparatus 313 is installed in a base floor BF located under the main floor. Each of the extreme ultraviolet (EUV) radiation source apparatus 300 and the exposure tool 311 are placed over pedestal plates PP1 and PP2 via dampers DP1 and DP2, respectively. The extreme ultraviolet (EUV) radiation source apparatus 300 and the exposure tool 311 are coupled to each other by a coupling mechanism, which may include a focusing unit.

The lithography system is an extreme ultraviolet (EUV) lithography system designed to expose a resist layer by extreme ultraviolet (EUV) light (or EUV radiation). The resist layer is a material sensitive to the extreme ultraviolet (EUV) light. The extreme ultraviolet (EUV) lithography system employs the extreme ultraviolet (EUV) radiation source apparatus 300 to generate extreme ultraviolet (EUV) light, such as extreme ultraviolet (EUV) light having a wavelength ranging between about 1 nm and about 100 nm. In one particular example, the extreme ultraviolet (EUV) radiation source 300 generates an extreme ultraviolet (EUV) light with a wavelength centered at about 13.5 nm. In the present embodiment, the extreme ultraviolet (EUV) radiation source 300 utilizes a mechanism of laser-produced plasma (LPP) to generate the extreme ultraviolet (EUV) radiation.

The exposure tool 311 includes various reflective optic components, such as convex/concave/flat mirrors, a mask holding mechanism including a mask stage, and wafer holding mechanism. The extreme ultraviolet (EUV) radiation EUV generated by the extreme ultraviolet (EUV) radiation source 300 is guided by the reflective optical components onto a mask secured on the mask stage. In some embodiments, the mask stage includes an electrostatic chuck (e-chuck) to secure the mask.

The exposure tool 311 includes a projection optics module for imaging the pattern of the mask on to a semiconductor substrate with a resist coated thereon secured on a substrate stage of the exposure tool 311. The projection optics module generally includes reflective optics. The extreme ultraviolet (EUV) radiation (EUV light) directed from the mask, carrying the image of the pattern defined on the mask, is collected by the projection optics module, thereby forming an image onto the resist.

As shown in FIG. 3, the extreme ultraviolet (EUV) radiation source 300 includes a target droplet generator 115 and a LPP collector 110, enclosed by a chamber 105. The target droplet generator 115 generates a plurality of target droplets DP. In some embodiments, the target droplets DP are tin (Sn) droplets. In some embodiments, the tin droplets each have a diameter about 30 microns (μm). In some embodiments, the tin droplets DP are generated at a rate about 50 droplets per second and are introduced into a zone of excitation ZE at a speed about 70 meters per second (m/s). Other material can also be used for the target droplets, for example, a tin containing liquid material such as eutectic alloy containing tin or lithium (Li).

The excitation laser LR2 generated by the excitation laser source apparatus 313 is a pulse laser. In some embodiments, the excitation layer includes a pre-heat laser and a main laser. The pre-heat laser pulse is used to heat (or pre-heat) the target droplet to create a low-density target plume, which is subsequently heated (or reheated) by the main laser pulse, generating increased emission of extreme ultraviolet (EUV) light.

In various embodiments, the pre-heat laser pulses have a spot size about 100 μm or less, and the main laser pulses have a spot size about 200-300 μm.

The excitation laser source apparatus 311 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source. The laser light LR1 generated by the excitation laser source apparatus 311 is guided by the laser guide optics 320 and focused into the excitation laser LR2 by the focusing apparatus 330, and then introduced into the extreme ultraviolet (EUV) radiation source apparatus 300.

The laser light LR2 is directed through windows (or lenses) into the zone of excitation ZE. The windows adopt a suitable material substantially transparent to the laser beams. The generation of the pulse lasers is synchronized with the generation of the target droplets. As the target droplets move through the excitation zone, the pre-pulses heat the target droplets and transform them into low-density target plumes. A delay between the pre-pulse and the main pulse is controlled to allow the target plume to form and to expand to an optimal size and geometry. When the main pulse heats the target plume, a high-temperature plasma is generated. The plasma emits extreme ultraviolet (EUV) radiation EUV, which is collected by the collector mirror 110. The collector 110 further reflects and focuses the extreme ultraviolet (EUV) radiation EUV for the lithography exposing processes. In some embodiments, a droplet catcher 120 is installed opposite the target droplet generator 115. The droplet catcher 120 is used for catching excessive target droplets. For example, some target droplets may be purposely missed by the laser pulses.

The collector 110 is designed with a proper coating material and shape to function as a mirror for extreme ultraviolet (EUV) collection, reflection, and focusing. In some embodiments, the collector 110 is designed to have an ellipsoidal geometry. In some embodiments, the collector 110 further includes a grating structure designed to effectively scatter the laser beam directed onto the collector 110. For example, a silicon nitride layer is coated on the collector 110 and is patterned to have a grating pattern.

As shown in FIG. 1, in the present embodiments, a buffer gas is supplied from a first buffer gas supply 130 through the aperture in collector 110 by which the pulse laser is delivered to the tin droplets. In some embodiments, the buffer gas is $H_2$, He, Ar, N or another inert gas. In certain embodiments, $H_2$ is used as H radicals generated by ionization of the buffer gas can be used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105.

As shown in FIG. 1, one or more debris collection mechanisms (DCMs) 150 are disposed along optical axis A1 between the zone of excitation ZE and an output port 160 of the extreme ultraviolet (EUV) radiation source 300. The DCM 150 is made of suitable material such as stainless steel, Cu, Al or ceramics. In the present embodiments, the surface of the DCM 150 is coated with a catalytic material. The catalytic material includes ruthenium (Ru), tin (Sn), tin oxide, titanium oxide, or any combination thereof.

Figure 4:
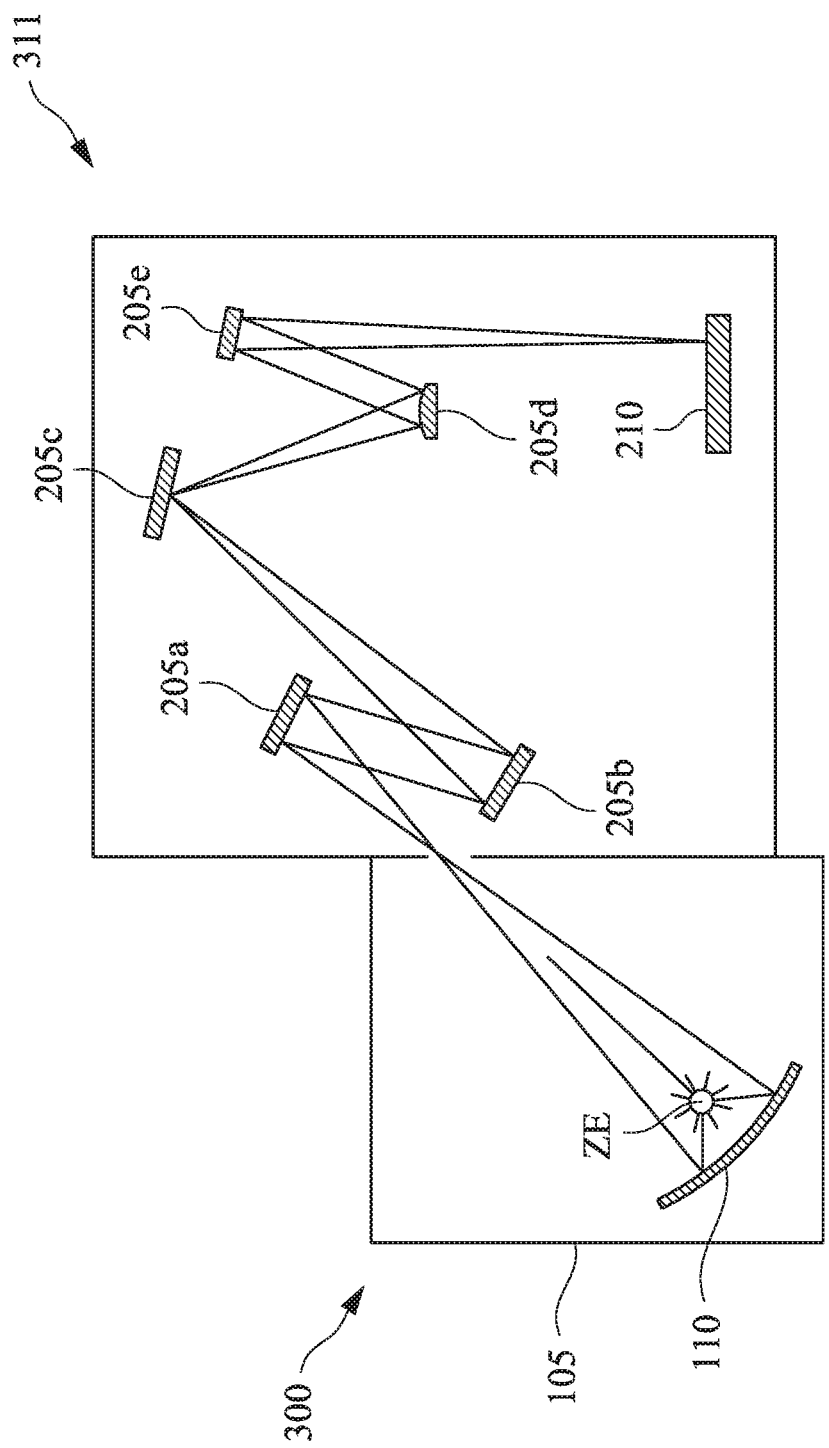
FIG. 4 is a simplified schematic diagram of a detail of an extreme ultraviolet lithography tool showing the exposure of photoresist coated substrate with a patterned beam of extreme ultraviolet (EUV) light.

FIG. 4 is a simplified schematic diagram of a detail of an extreme ultraviolet lithography tool showing the exposure of photoresist coated substrate 210 with a patterned beam of extreme ultraviolet (EUV) light. The exposure device 311 is an integrated circuit lithography tool such as a stepper, scanner, step and scan system, direct write system, device using a contact and/or proximity mask, etc., provided with one or more optics 205a, 205b, for example, to illuminate a patterning optic 205c, such as a reticle, with a beam of extreme ultraviolet (EUV) light, to produce a patterned beam, and one or more reduction projection optics 205d, 205e, for projecting the patterned beam onto the substrate 210. A mechanical assembly (not shown) may be provided for generating a controlled relative movement between the substrate 210 and patterning optic 205c. As further shown in FIG. 4, the extreme ultraviolet lithography tool includes the extreme ultraviolet (EUV) light source 300 including plasma at ZE emitting extreme ultraviolet (EUV) light in a chamber 105 that is collected and reflected by the collector 110 along a path into the exposure device 311 to irradiate the substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is not meant to be limited to components which operate solely within one or more specific wavelength range(s) such as at the extreme ultraviolet (EUV) output light wavelength, the irradiation laser wavelength, a wavelength suitable for metrology or any other specific wavelength.

In some embodiments, the extreme ultraviolet (EUV) polarization splitter is be located between the extreme ultraviolet (EUV) radiation source 300 and the exposure device 311 or within the exposure device such that extreme ultraviolet (EUV) light from the extreme ultraviolet (EUV) radiation source 300 is incident on the EUV polarization splitter. The extreme ultraviolet (EUV) light is polarized by the EUV polarization splitter such that the transverse electric (TE) waves from the extreme ultraviolet (EUV) light are used to expose the substrate 210.

Figure 5:
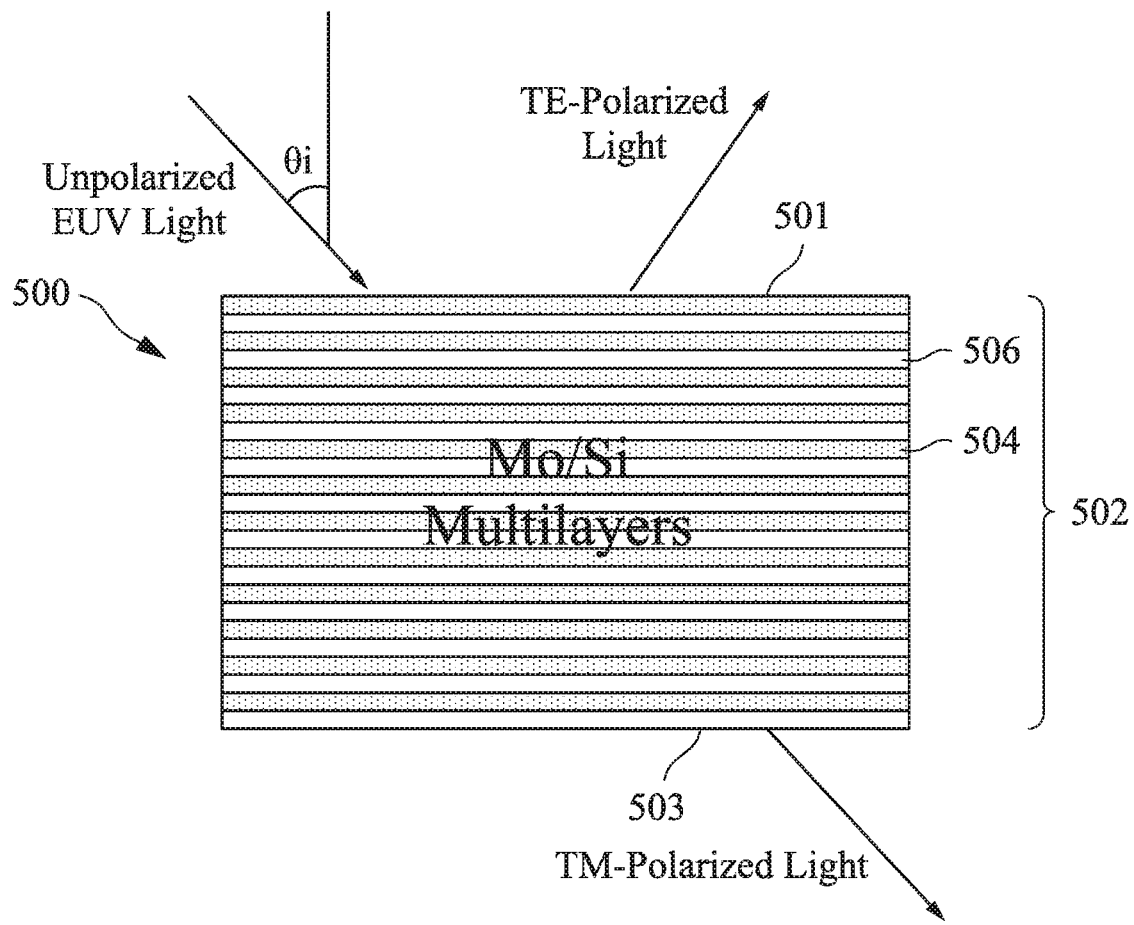
FIG. 5 illustrates an extreme ultraviolet (EUV) polarization splitter, according to embodiments.

FIG. 5 illustrates an extreme ultraviolet (EUV) polarization splitter 500, according to embodiments. The extreme ultraviolet (EUV) polarization splitter 500 is a multilayer structure 502 including a plurality of film pairs, such as molybdenum-silicon (Mo/Si) film pairs (e.g., a layer of molybdenum 504 above or below a layer of silicon 506 in each film pair). With reference to the orientation in FIG. 5, the polarization splitter includes a first main surface 501 and a second main surface 503 opposite to the first main surface 501. The first main surface 501 is the top surface of the topmost film of the multilayer structure 502 and the second main surface 503 is the bottom surface of the bottommost film of the multilayer structure 502. The first main surface 501 and the second main surface 503 are both exposed, in that the first main surface 501 and the second main surface 503 do not contact other layers.

The unpolarized extreme ultraviolet (EUV) light is incident on the extreme ultraviolet (EUV) polarization splitter 500 at an angle of incidence (AOI) θi, and the extreme ultraviolet (EUV) polarization splitter 500 interacts with the incident EUV light and splits the EUV light into its constituent transverse electric (TE) waves and transverse magnetic (TM) waves. As illustrated, the transverse electric (TE) waves are reflected by the extreme ultraviolet (EUV) polarization splitter 500 and are depicted as TE polarized light in FIG. 5. The transverse magnetic (TM) waves are transmitted (or refracted) through the extreme ultraviolet (EUV) polarization splitter 500 and are depicted as TM polarized light in FIG. 5. The Mo/Si multilayer (ML) provides an improved refractive index contrast for extreme ultraviolet (EUV) light. In order to obtain the desired polarization selectivity, the thickness of Mo and/or Si layers is manipulated to obtain a desired degree of polarization. Additionally, or alternatively, the angle of incidence (AOI) θi of the extreme ultraviolet (EUV) light is also manipulated. Although the unpolarized extreme ultraviolet (EUV) light is illustrated as being incident on the first main surface 501, embodiments are not limited in this regard. In other embodiments, the unpolarized extreme ultraviolet (EUV) light is incident on the second main surface 503.

The degree of polarization $R_{pol}$ is given by $$R_{pol} = \left| \frac{I_{TM} - I_{TE}}{I_{TM} + I_{TE}} \right|$$

wherein, $I_{TM}$ represents the intensity of the transverse magnetic (TM) light and $I_{TE}$ represents the intensity of the transverse electric (TE) light. $R_{pol}=0$ for unpolarized light, and $R_{pol}=1$ for completely polarized light. For partially polarized light, $0<R_{pol}<1$.

As discussed below, it should be noted that the TE polarized light does not include only the transverse electric (TE) waves of the unpolarized extreme ultraviolet (EUV) light. While the transverse electric (TE) waves constitute a majority portion of the TE polarized light, some transverse magnetic (TM) waves of the unpolarized extreme ultraviolet (EUV) light are also present. Similarly, it should be noted that the TM polarized light does not include only the transverse magnetic (TM) waves of the unpolarized extreme ultraviolet (EUV) light. While the transverse magnetic (TM) waves constitute a majority portion of the TM polarized light, some transverse electric (TE) waves of the unpolarized extreme ultraviolet (EUV) light are also present.

Figure 6:
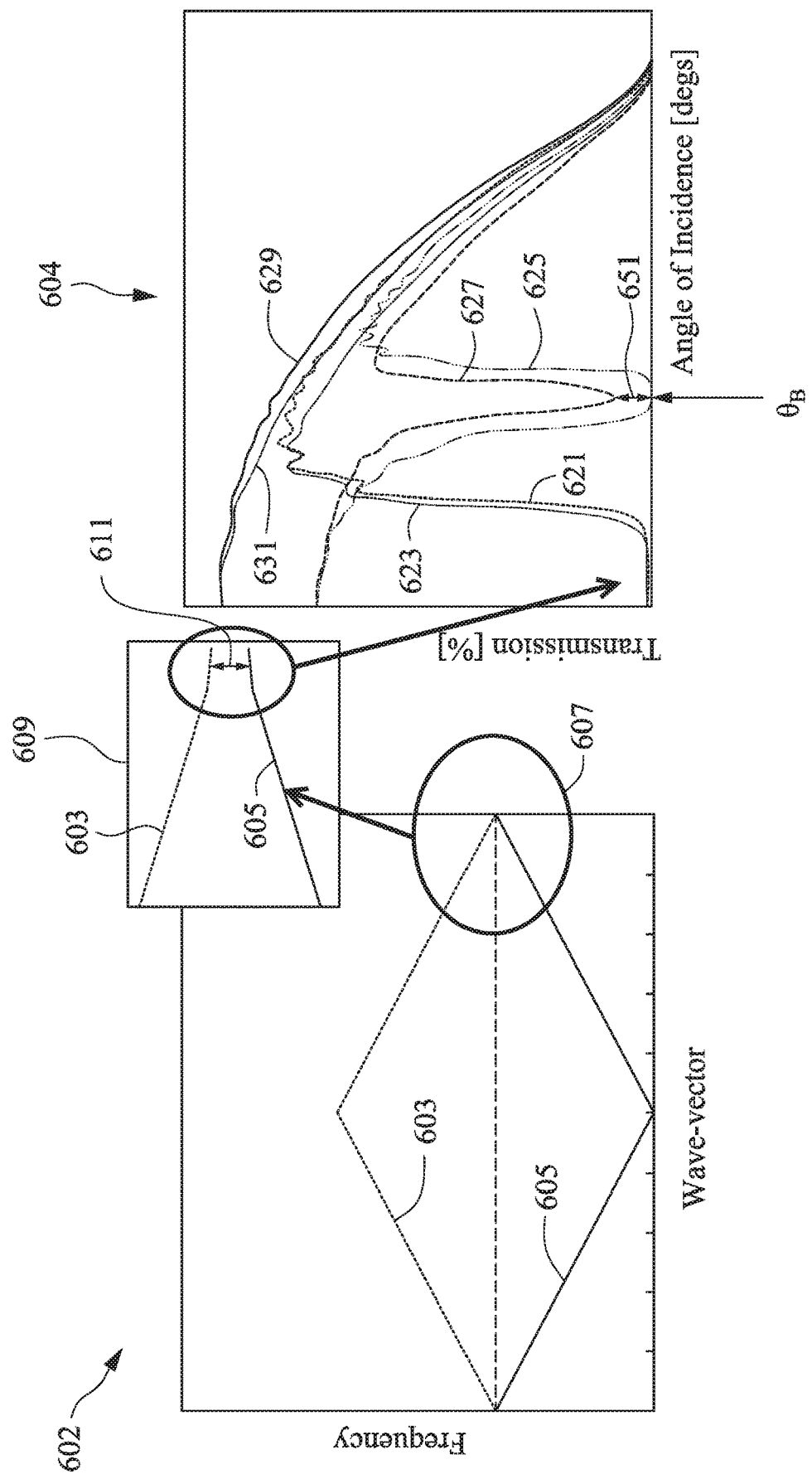
FIG. 6 is a band diagram (or dispersion relation of light) for a first multilayer structure including Mo/Si multilayer and a graph indicating a variation of the transmission of the incident unpolarized EUV light with change in angle of incidence, according to embodiments.

FIG. 6 is a band diagram (or dispersion relation of light) 602 for a first multilayer structure including Mo/Si multilayer and a graph 604 indicating a variation of the transmission of the incident unpolarized EUV light with change in angle of incidence, according to embodiments. In the band diagram 602, the frequency of photons in the incident EUV light is plotted on the ordinate and the wavevector (or momentum) of the photons is plotted on the abscissa. The band diagram 602 is obtained for a EUV light wavelength of around 13.5 nm. The curves 603 and 605 indicate the order of the modes propagating through the Mo/Si multilayer. The first multilayer structure includes molybdenum layer of thickness 3 nm and silicon layer of thickness 4 nm. The first multilayer structure may be similar to the multilayer structure 502 in some aspects. The ends of the curves 603 and 605 within the encircled region 607 are illustrated in greater detail in the inset 609. As illustrated in inset 609, the curves 603 and 605 are separated by a first gap 611. The gap 611 indicates a first range of frequencies of the incident EUV light.

Referring to the graph 604, curve 621 represents variation in the transmission of the transverse electric (TE) wave and curve 623 represents variation in the transmission of the transverse magnetic (TM) wave when EUV light of a frequency from the first range of frequencies of the first gap 611 is incident on the first multilayer structure. As illustrated, the transmission of the transverse electric (TE) wave and the transmission of the transverse magnetic (TM) wave through the first multilayer structure is negligible for initial values of angle of incidence of the EUV light. This indicates that the transverse electric (TE) wave and the transverse magnetic (TM) wave are both reflected from the first multilayer structure. With an increase in the angle of incidence, the transmission of the transverse electric (TE) wave and the transmission of the transverse magnetic (TM) wave through the first multilayer structure initially increases and then decreases. This indicates that the transverse electric (TE) wave and the transverse magnetic (TM) wave are initially transmitted and then reflected from the first multilayer structure. As understood from the band diagram 602, the transverse electric (TE) wave and the transverse magnetic (TM) wave closely follow each other. Thus, from the curves 621 and 623, it is understood that the first multilayer structure offers reduced polarization of incident EUV light.

In some embodiments, the polarization of the incident EUV light can be increased by varying the thicknesses of the molybdenum layer and/or the silicon layer of the multilayer structure 502. In addition, or alternatively, the angle of incidence of the EUV light can be varied to achieve a desired polarization of the EUV light.

Referring to the graph 604, curve 625 represents variation in the transmission of the transverse electric (TE) wave and curve 627 represents variation in the transmission of the transverse magnetic (TM) wave when EUV light is incident on a second multilayer structure. The second multilayer structure may be similar to the multilayer structure 502 in some aspects. In some embodiments, the second multilayer structure includes a silicon layer of thickness 5 nm and a molybdenum layer of thickness 3 nm. The band diagram of the second multilayer structure is similar in some aspects with the band diagram 602, and exhibits a second gap including a second range of frequencies. The EUV light incident on the second multilayer structure has a frequency from the second range of frequencies. In an embodiment, the second range of frequencies are different from the first range of frequencies.

As illustrated, when the angle of incidence is equal to the Brewster's angle $\theta_B$, a separation between the curves 625 and 627 is the maximum, indicated by the separation 651. At the Brewster's angle $\theta_B$, the transmission of the transverse magnetic (TM) waves is more than the transmission of the transverse electric (TE) waves. In other words, the reflection of the transverse magnetic (TM) waves is less than the reflection of the transverse electric (TE) waves. Thus, at the Brewster's angle $\theta_B$, more transverse magnetic (TM) waves are transmitted through the second multilayer structure compared to the transverse electric (TE) waves. Similarly, at the Brewster's angle $\theta_B$, more transverse electric (TE) waves are reflected by the second multilayer structure compared to the transverse magnetic (TM) waves. Accordingly, unlike the first multilayer structure, the second multilayer structure offers improved splitting of the transverse magnetic (TM) waves and the transverse electric (TE) waves, and thereby an improved polarization (or improved polarization selectivity) of the EUV light when incident at the Brewster's angle $\theta_B$.

Referring to the graph 604, curve 629 represents variation in the transmission of the transverse electric (TE) wave and curve 631 represents variation in the transmission of the transverse magnetic (TM) wave when EUV light is incident on a third multilayer structure. The third multilayer structure may be similar to the multilayer structure 502 in some aspects. In some embodiments, the third multilayer structure includes a silicon layer of thickness 3 nm and a molybdenum layer of thickness 3 nm. The band diagram of the third multilayer structure is similar in some aspects with the band diagram 602, and exhibits a third gap including a third range of frequencies. The EUV light incident on the third multilayer structure has a frequency from the third range of frequencies. In an embodiment, the third range of frequencies are different from the first and second range of frequencies.

As illustrated, the transmission of both the transverse electric (TE) waves and the transverse magnetic (TM) waves is high for low values of the angle of incidence and decreases as the angle of incidence increases. The separation of the curves 629 and 631 is negligible and the curves follow each other. Thus, both the transverse electric (TE) waves and the transverse magnetic (TM) waves incident on the third multilayer structure are substantially transmitted or substantially reflected. Thus, like the first multilayer structure, the third multilayer structure offers poor polarization of the incident EUV light.

Table 1 lists samples thicknesses of molybdenum (Mo) and silicon (Si) layers of a multilayer structure and the degree of polarization (DOP) for transverse electric (TE) waves and transverse magnetic (TM) waves for a given angle of incidence (AOI) of EUV light incident on the multilayer structure. Table 1 also indicates the variation on the number of multilayer pairs, the Mo thickness, the Si thickness, and the angle of incidence.

TABLE 1

| ML (pairs) | Mo Thickness (nm) | Si Thickness (nm) | Angle of Incidence (Degree) | Transmission (%) | Reflection (%) | Transmission DOP (%) | Reflection DOP (%) |
| --- | --- | --- | --- | --- | --- | --- | --- |
| 20 ± 2 | 2.5 ± 0.3 | 7.0 ± 0.3 | 42.5 ± 2.0 | 25.1 | 34.37 | 85.49 | 99.94 |

Figure 7:
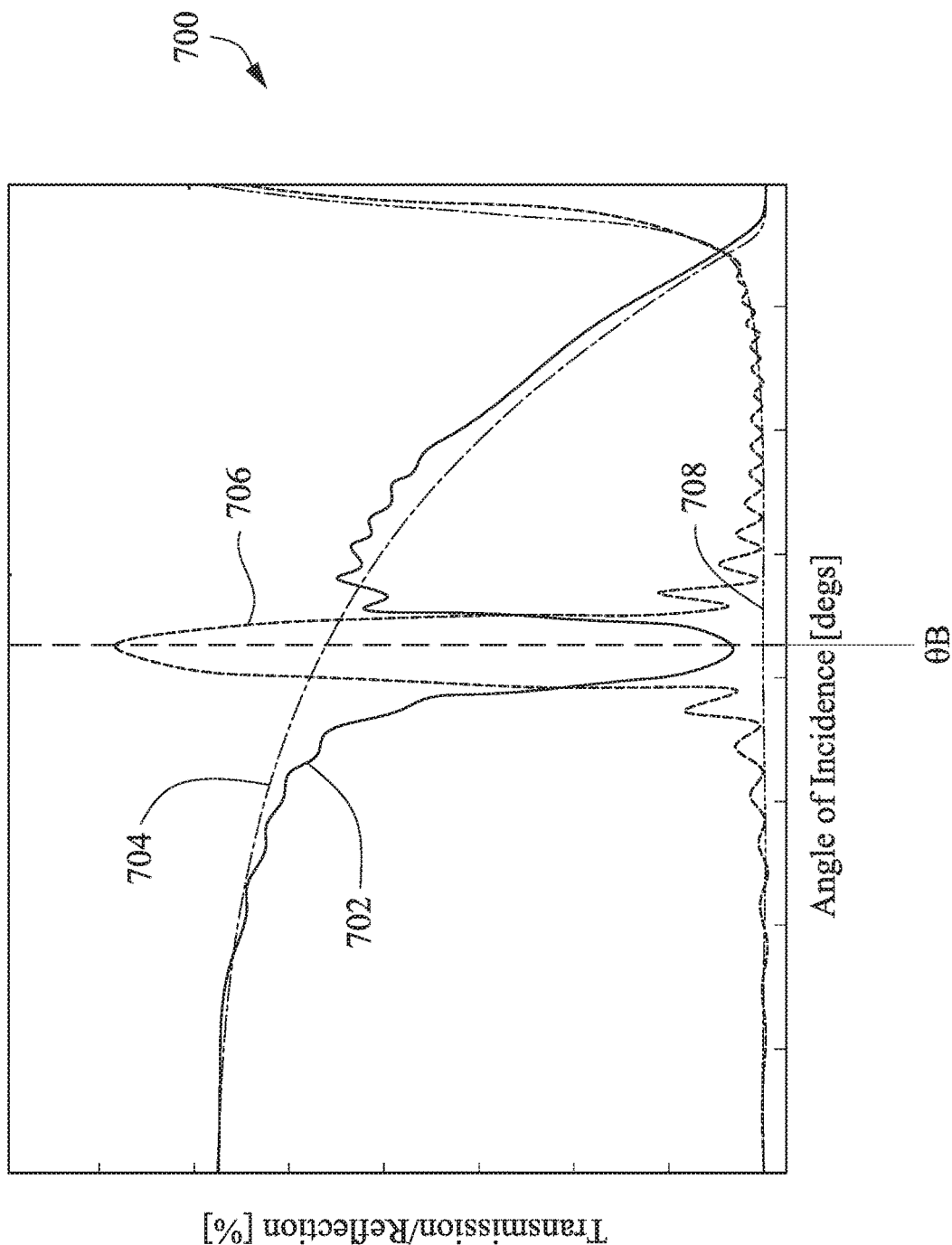
FIG. 7 is a graph illustrates variation in the transmission/reflection of transverse electric (TE) waves and transverse magnetic (TM) waves of EUV light incident on a multilayer structure.

FIG. 7 is a graph 700 illustrates variation in the transmission/reflection of transverse electric (TE) waves and transverse magnetic (TM) waves of EUV light incident on the multilayer structure having the number of multilayer pairs, the Mo thickness, and the Si thickness as in Table 1. In the graph 700, the amount of transmission/reflection of transverse electric (TE) waves and transverse magnetic (TM) waves of the incident EUV light is plotted on the ordinate and the angle of incidence is plotted on the abscissa.

Curve 702 represents the variation in the transmission of transverse electric (TE) waves and curve 704 represents the variation in the transmission of transverse magnetic (TM) waves. As indicated by the curve 702, the transmission of transverse electric (TE) waves decreases with an increase in the angle of incidence until the angle of incidence reaches the Brewster's angle $\theta_B$ at which amount of transverse electric (TE) waves transmitted through the multilayer structure is minimum. At the Brewster's angle $\theta_B$ of the angle of incidence, substantially all transverse electric (TE) waves of the incident EUV light are reflected from the multilayer structure. Further increasing the angle of incidence beyond the Brewster's angle $\theta_B$, increases the transmission of the transverse electric (TE) waves. The transmission of the transverse electric (TE) waves decreases again as the angle of incidence increases.

Variation in the curve 704 indicates that the transmission of transverse electric (TE) waves decreases with an increase in the angle of incidence. The transmission of transverse electric (TE) waves does not decrease as much as the transmission of transverse magnetic (TM) waves at the Brewster's angle $\theta_B$.

Curve 706 represents the variation in the reflection of transverse electric (TE) waves and curve 708 represents the variation in the reflection of transverse magnetic (TM) waves. As indicated by the curve 706, the reflection of transverse electric (TE) waves increases with an increase in the angle of incidence until the angle of incidence reaches the Brewster's angle $\theta_B$ at which amount of transverse electric (TE) waves reflected by the multilayer structure is maximum. At the Brewster's angle $\theta_B$, minimum amount of transverse electric (TE) waves of the incident EUV light are transmitted through the multilayer structure. Further increasing the angle of incidence beyond the Brewster's angle $\theta_B$, decreases the reflection of the transverse electric (TE) waves. As seen from the curve 708, there is substantially no reflection of the transverse magnetic (TM) waves with an increase in the angle of incidence.

As observed, about the Brewster's angle $\theta_B$, there is a fairly sharp rise and fall in the transmission/reflection of the transverse electric (TE) waves and transverse magnetic (TM) waves. This indicates that the multilayer structure offers a relatively high polarization selectivity at the Brewster's angle $\theta_B$. At the Brewster's angle $\theta_B$, the reflected light can be considered to constitute purely transverse electric (TE) waves and the transmitted light can be considered to constitute purely transverse magnetic (TM) waves.

Figure 8A:
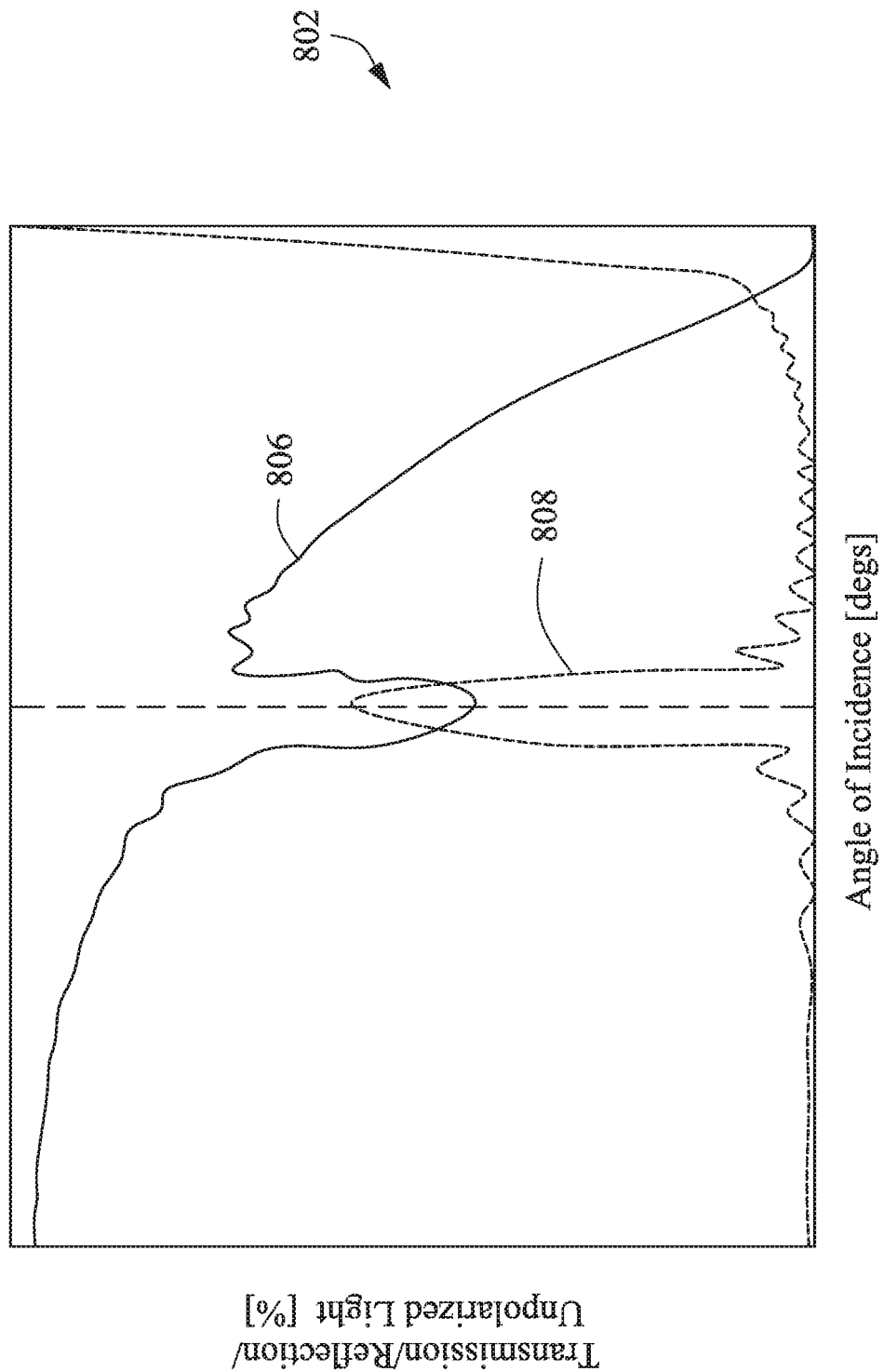
FIG. 8A is a graph indicating average values of the transmission/reflection of unpolarized light.

FIG. 8A is a graph 802 indicating average values of the transmission/reflection of unpolarized light containing transverse electric (TE) waves and transverse magnetic (TM) waves. FIG. 8A depicts the overall reflectance/transmittance of the unpolarized EUV light when illuminated on the material. Referring to FIG. 8A, with continued reference to FIG. 7, curve 806 is the average of the curves 702 and 704, and curve 808 is the average of the curves 706 and 708.

Figure 8B:
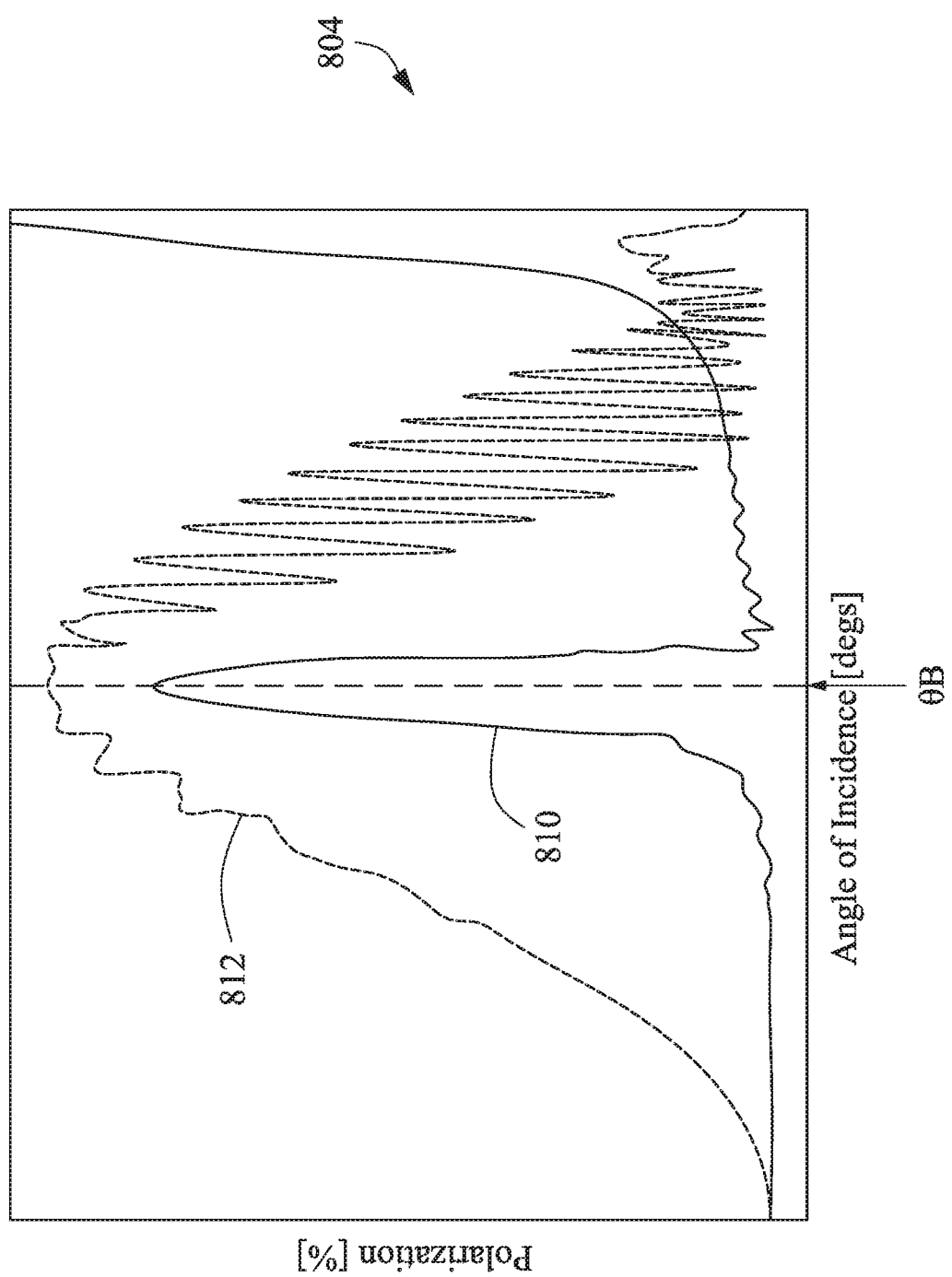
FIG. 8B is a graph indicating the variation in the polarization ratio (or the degree of polarization) due to variation in the angle of incidence.

FIG. 8B is a graph 804 indicating the variation in the polarization ratio (or the degree of polarization) due to variation in the angle of incidence. Curve 810 represents the polarization ratio for EUV radiation transmitting through the multilayer structure having the structure from Table 1. As illustrated, the polarization ratio is maximum at the Brewster's angle $\theta_B$ of the angle of incidence. Curve 812 represents the polarization ratio for EUV radiation reflecting from the multilayer structure having the structure from Table 1. As illustrated in FIGS. 8A and 8B, the polarization ratio is maximum at the Brewster's angle $\theta_B$.

Figure 9:
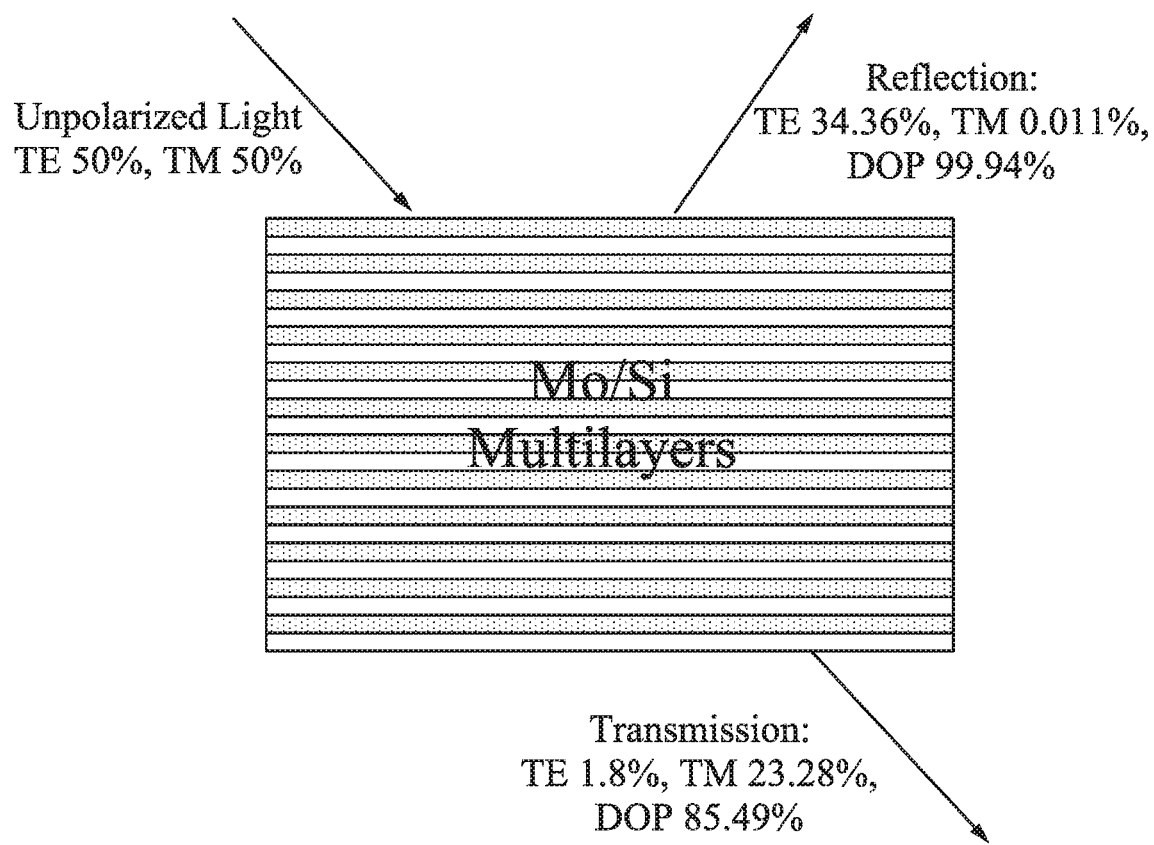
FIG. 9 illustrates a sample Mo/Si multilayer structure and polarization ratios for unpolarized extreme ultraviolet (EUV) light including about 50% transverse electric (TE) waves and about 50% transverse magnetic (TM) waves, according to embodiments disclosed.

FIG. 9 illustrates a sample Mo/Si multilayer structure and polarization ratios for unpolarized extreme ultraviolet (EUV) light including about 50% transverse electric (TE) waves and about 50% transverse magnetic (TM) waves, according to embodiments disclosed. The unpolarized extreme ultraviolet (EUV) light is incident at an angle of about 42.5°. As illustrated, the reflected light includes about 34.36% transverse electric (TE) waves and around 0.011% transverse magnetic (TM) waves. This indicates a depth of polarization (DOP) of around 99.94%. As illustrated, the transmitted light includes about 1.8% transverse electric (TE) waves and around 23.28% transverse magnetic (TM) waves. This indicates a depth of polarization (DOP) of around 85.49%.

Figure 10:
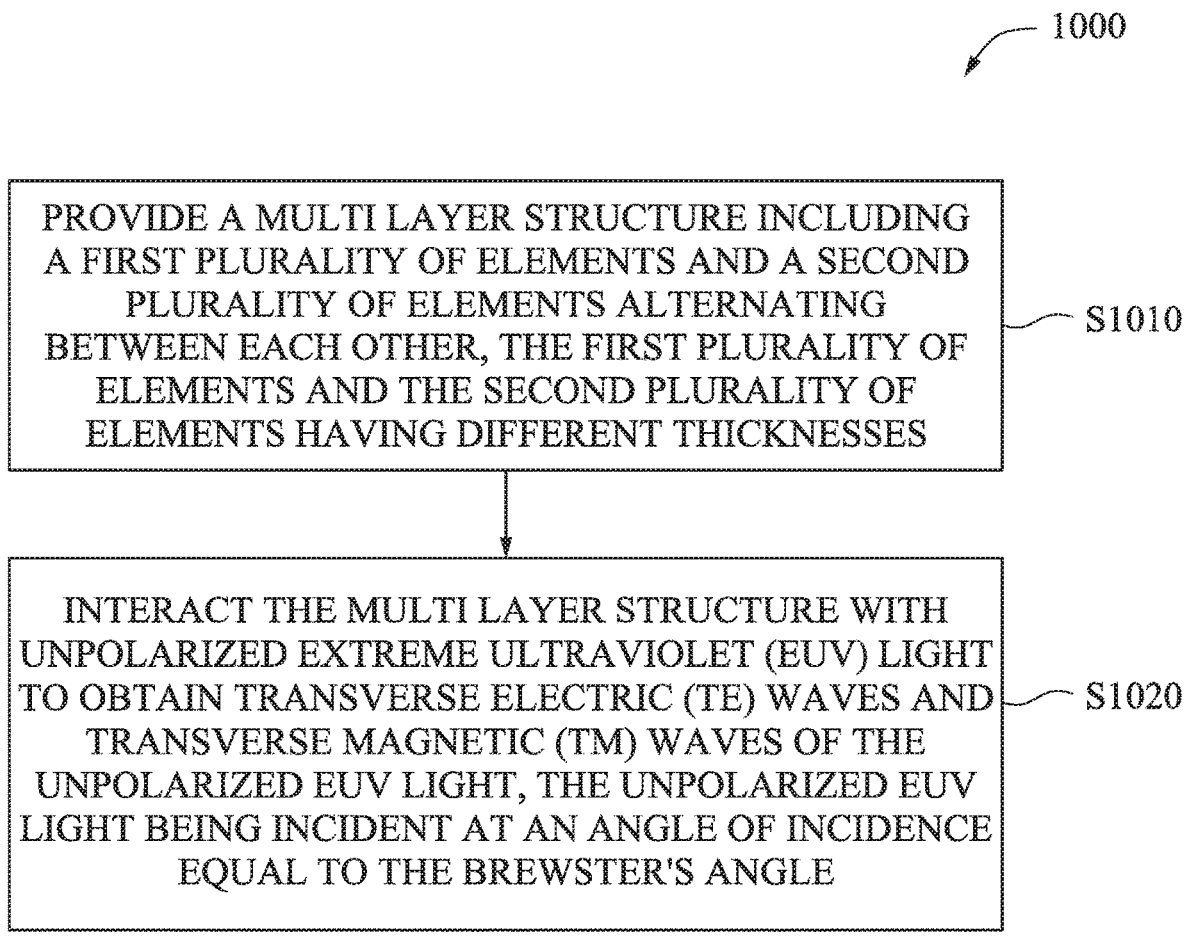
FIG. 10 is a flowchart illustrating a method of polarizing incident unpolarized light according to an embodiment of the present disclosure.

An embodiment of the present disclosure is a method 1000 of polarizing incident unpolarized light according to the flowchart illustrated in FIG. 10. It is understood that additional operations can be provided before, during, and after processes discussed in FIG. 10, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method includes an operation S1010 of providing a multilayer structure including a first plurality of elements and a second plurality of elements alternating between each other. In an embodiment, the first plurality of elements and the second plurality of elements having different thicknesses. In operation S1020, the multilayer structure is interacted with unpolarized extreme ultraviolet (EUV) light to obtain transverse electric (TE) waves and transverse magnetic (TM) waves of the unpolarized EUV light. The unpolarized EUV light is incident at an angle of incidence equal to the Brewster's angle.

The polarization filter, according to disclosed embodiments, provides numerous advantages. By splitting the incident EUV light into its constituent transverse electric (TE) waves and transverse magnetic (TM) waves, the polarization splitter permits an EUV lithography system to utilize the transverse electric (TE) waves for exposing a reticle. Since the transverse electric (TE) waves provide a better image contrast, an improved image of a mask is obtained on the reticle.

An embodiment of the disclosure is a polarization filter that includes a multilayer structure including a first plurality of elements and a second plurality of elements alternating between each other. The first plurality of elements and the second plurality of elements have different thickness. The multilayer structure has a first main surface and a second main surface opposite to the first main surface, both the first and second main surfaces being exposed. The thicknesses of the first plurality of elements and the second plurality of elements are such that transverse electric (TE) waves and transverse magnetic (TM) waves are obtained from unpolarized extreme ultraviolet (EUV) light incident on the first main surface of the multilayer structure. In an embodiment, wherein the first plurality of elements include molybdenum (Mo) and the second plurality of elements include silicon (Si). In an embodiment, each element of the first plurality of elements has a thickness of between 2.2 nm to 2.8 nm and each element of the second plurality of elements has a thickness of between 6.7 nm and 7.3 nm. In an embodiment, the extreme EUV light is incident at a Brewster's angle, and the Brewster's angle ranges from 40.5 degrees to 44.5 degrees. In an embodiment, the multilayer structure includes the first plurality of elements and the second plurality of elements arranged in pairs, a number of pairs being between 18 to 22, and each pair including an element from the first plurality of elements and an element from the second plurality of elements. In an embodiment, the first plurality of elements and the second plurality of elements are configured such that the incident unpolarized EUV light is partially reflected and partially transmitted. In an embodiment, the transverse electric (TE) waves in the incident unpolarized EUV light are partially reflected at the first main surface, and transverse magnetic (TM) waves in the incident unpolarized EUV light are partially transmitted and exit from the second main surface.

Another embodiment of the disclosure is a method that includes providing a multilayer structure including a first plurality of elements and a second plurality of elements alternating between each other. The first plurality of elements and the second plurality of elements have different thicknesses. The multilayer structure are interacted with unpolarized extreme ultraviolet (EUV) light to obtain transverse electric (TE) waves and transverse magnetic (TM) waves of the unpolarized EUV light. The unpolarized EUV light is incident at an angle of incidence equal to the Brewster's angle. In an embodiment, the unpolarized EUV light incident on the multilayer structure is partially reflected and partially transmitted, and the method further includes varying the thicknesses of the first plurality of elements and the second plurality of elements such that the partially reflected light includes a desired amount of the transverse electric (TE) waves, and the partially transmitted light includes a desired amount of the transverse magnetic (TM) waves. In an embodiment, varying the thicknesses of the first plurality of elements and the second plurality of elements includes varying the thicknesses of the first plurality of elements and the second plurality of elements such that an amount of the transverse electric (TE) waves in the partially reflected light are greater than an amount of the transverse magnetic (TM) waves in the partially reflected light. In an embodiment, varying the thicknesses of the first plurality of elements and the second plurality of elements includes varying the thicknesses of the first plurality of elements and the second plurality of elements such that an amount of the transverse magnetic (TM) waves in the partially transmitted light are greater than an amount of the transverse electric (TE) waves in the partially transmitted light. In an embodiment, providing the multilayer structure includes providing the multilayer structure having the first plurality of elements including molybdenum (Mo). Each element of the first plurality of elements has a thickness of between 2.2 nm to 2.8 nm, and the second plurality of elements including silicon (Si). Each element of the second plurality of elements has a thickness of between 6.7 nm and 7.3 nm. In an embodiment, providing the multilayer structure includes providing the multilayer structure having the first plurality of elements and the second plurality of elements arranged in pairs. A number of pairs is between 18 to 22 pairs, and each pair includes an element from the first plurality of elements and an element from the second plurality of elements. In an embodiment, the method further includes adjusting the angle of incidence of the unpolarized EUV light in a range from 40.5 degrees to 44.5 degrees with respect to a normal line of the multilayer structure. In an embodiment, the multilayer structure and the angle of incidence of the unpolarized EUV light are configured such that a reflectivity of reflected TM waves is below 0.1%. In an embodiment, the method further includes providing an extreme ultraviolet (EUV) lithography system including the multilayer structure. A reticle is exposed positioned in the EUV lithography system to the transverse electric (TE) waves obtained from the multilayer structure.

Another embodiment of the disclosure is an EUV lithography apparatus that includes a reflective optics, a wafer stage, and a polarization filter along a light path within the reflective optics. The polarization filter includes a multilayer structure including a plurality of layers of molybdenum (Mo) and a plurality of layers of silicon (Si) alternating between each other. The plurality of layers of molybdenum (Mo) and the plurality of layers of silicon (Si) have different thicknesses. The EUV lithography apparatus receives unpolarized extreme ultraviolet (EUV) light. The plurality of layers of molybdenum (Mo) and the plurality of layers of silicon (Si) are configured to interact with the unpolarized extreme ultraviolet (EUV) light incident on the multilayer structure to obtain transverse electric (TE) waves and transverse magnetic (TM) waves in the unpolarized EUV light, and the transverse electric (TE) waves obtained by the polarization filter are directed toward the wafer stage. In an embodiment, the multilayer structure includes 18-22 pairs of the layers of molybdenum (Mo) and layers of silicon (Si) and each pair includes a layer of molybdenum (Mo) and a layer of silicon (Si). In an embodiment, the plurality of layers of molybdenum (Mo) and the plurality of layers of silicon (Si) are configured such that the unpolarized EUV light incident on multilayer structure is partially reflected and partially transmitted. The transverse electric (TE) waves in the incident unpolarized EUV light are partially reflected, and transverse magnetic (TM) waves in the incident unpolarized EUV light are partially transmitted. In an embodiment, an angle of incidence of the unpolarized EUV light is set in a range from 40.5 degrees to 44.5 degrees with respect to a normal line of the multilayer structure.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A polarization filter, comprising:
a multilayer structure including a first plurality of elements and a second plurality of elements alternating between each other, wherein
the first plurality of elements and the second plurality of elements have different thickness,
the multilayer structure has a first main surface and a second main surface opposite to the first main surface, both the first and second main surfaces being exposed,
the thicknesses of the first plurality of elements and the second plurality of elements are such that transverse electric (TE) waves and transverse magnetic (TM) waves are obtained from unpolarized extreme ultraviolet (EUV) light, and
the unpolarized EUV light is incident on the first main surface of the multilayer structure and the transverse electric (TE) waves in the incident unpolarized EUV light are partially reflected at the first main surface and the transverse magnetic (TM) waves in the incident unpolarized EUV light are partially transmitted and exit from the second main surface.

2. The polarization filter of claim 1, wherein the first plurality of elements include molybdenum (Mo) and the second plurality of elements include silicon (Si).

3. The polarization filter of claim 2, wherein each element of the first plurality of elements has a thickness of between 2.2 nm to 2.8 nm and each element of the second plurality of elements has a thickness of between 6.7 nm and 7.3 nm.

4. The polarization filter of claim 1, wherein the extreme EUV light is incident at a Brewster's angle, and wherein the Brewster's angle ranges from 40.5 degrees to 44.5 degrees.

5. The polarization filter of claim 1, wherein the multilayer structure includes the first plurality of elements and the second plurality of elements arranged in pairs, a number of pairs being between 18 to 22, and each pair including an element from the first plurality of elements and an element from the second plurality of elements.

6. The polarization filter of claim 1, wherein the first plurality of elements and the second plurality of elements are configured such that the incident unpolarized EUV light is partially reflected and partially transmitted.

7. A method, comprising:
providing a multilayer structure including a first plurality of elements and a second plurality of elements alternating between each other, the first plurality of elements and the second plurality of elements having different thicknesses; and
interacting the multilayer structure with unpolarized extreme ultraviolet (EUV) light to obtain transverse electric (TE) waves and transverse magnetic (TM) waves of the unpolarized EUV light, wherein the unpolarized EUV light is incident at an angle of incidence equal to the Brewster's angle, the unpolarized EUV light is incident on a first main surface of the multilayer structure, the transverse electric (TE) waves in the incident unpolarized EUV light are partially reflected at the first main surface, and the transverse magnetic (TM) waves in the incident unpolarized EUV light are partially transmitted and exit from a second main surface of the multilayer structure opposite to the first main surface.

8. The method of claim 7, further comprising:
varying the thicknesses of the first plurality of elements and the second plurality of elements such that the partially reflected light includes a desired amount of the transverse electric (TE) waves, and the partially transmitted light includes a desired amount of the transverse magnetic (TM) waves.

9. The method of claim 8, wherein varying the thicknesses of the first plurality of elements and the second plurality of elements includes varying the thicknesses of the first plurality of elements and the second plurality of elements such that an amount of the transverse electric (TE) waves in the partially reflected light are greater than an amount of the transverse magnetic (TM) waves in the partially reflected light.

10. The method of claim 8, wherein varying the thicknesses of the first plurality of elements and the second plurality of elements includes varying the thicknesses of the first plurality of elements and the second plurality of elements such that an amount of the transverse magnetic (TM) waves in the partially transmitted light are greater than an amount of the transverse electric (TE) waves in the partially transmitted light.

11. The method of claim 8, wherein providing the multilayer structure includes providing the multilayer structure having the first plurality of elements including molybdenum (Mo), each element of the first plurality of elements having a thickness of between 2.2 nm to 2.8 nm, and the second plurality of elements including silicon (Si), each element of the second plurality of elements having a thickness of between 6.7 nm and 7.3 nm.

12. The method of claim 8, wherein providing the multilayer structure includes providing the multilayer structure having the first plurality of elements and the second plurality of elements arranged in pairs, wherein a number of pairs is between 18 to 22 pairs, and each pair includes an element from the first plurality of elements and an element from the second plurality of elements.

13. The method of claim 12, further comprising adjusting the angle of incidence of the unpolarized EUV light in a range from 40.5 degrees to 44.5 degrees with respect to a normal line of the multilayer structure.

14. The method of claim 7, wherein the multilayer structure and the angle of incidence of the unpolarized EUV light are configured such that a reflectivity of reflected TM waves is below 0.1%.

15. The method of claim 7, further comprising:
providing an extreme ultraviolet (EUV) lithography system including the multilayer structure; and
exposing a reticle positioned in the EUV lithography system to the transverse electric (TE) waves obtained from the multilayer structure.

16. An EUV lithography apparatus, comprising:
a reflective optics;
a wafer stage; and
a polarization filter along a light path within the reflective optics, wherein:
the polarization filter comprises:
a multilayer structure including a plurality of layers of molybdenum (Mo) and a plurality of layers of silicon (Si) alternating between each other,
the plurality of layers of molybdenum (Mo) and the plurality of layers of silicon (Si) have different thicknesses,
the EUV lithography apparatus receives unpolarized extreme ultraviolet (EUV) light,
the plurality of layers of molybdenum (Mo) and the plurality of layers of silicon (Si) are configured to interact with the unpolarized extreme ultraviolet (EUV) light incident on the multilayer structure to obtain transverse electric (TE) waves and transverse magnetic (TM) waves in the unpolarized EUV light,
the unpolarized EUV light is incident on a first main surface of the multilayer structure,
the transverse electric (TE) waves in the incident unpolarized EUV light are partially reflected at the first main surface,
the transverse magnetic (TM) waves in the incident unpolarized EUV light are partially transmitted and exit from a second main surface of the multilayer structure opposite to the first main surface, and
the transverse electric (TE) waves obtained by the polarization filter are directed toward the wafer stage.

17. The EUV lithography apparatus of claim 16, wherein the multilayer structure includes 18-22 pairs of the layers of molybdenum (Mo) and layers of silicon (Si) and each pair includes a layer of molybdenum (Mo) and a layer of silicon (Si).

18. The EUV lithography apparatus of claim 16, wherein an angle of incidence of the unpolarized EUV light is set in a range from 40.5 degrees to 44.5 degrees with respect to a normal line of the multilayer structure.

* * * * *